(12) United States Patent
Meeks

(10) Patent No.: US 7,439,882 B1
(45) Date of Patent: Oct. 21, 2008

(54) OPTIMIZED DECOMPRESSION USING ANNOTATED BACK BUFFER

(75) Inventor: Michael Meeks, Newmarket (GB)

(73) Assignee: Novell, Inc., Provo, UT (US)

( * ) Notice: Subject to any disclaimer, the term of this patent is extended or adjusted under 35 U.S.C. 154(b) by 20 days.

(21) Appl. No.: 11/783,069

(22) Filed: Apr. 5, 2007

(51) Int. Cl.
*H03M 7/00* (2006.01)

(52) U.S. Cl. .......................................... 341/59; 341/60

(58) Field of Classification Search .............. 341/50–90
See application file for complete search history.

(56) References Cited

U.S. PATENT DOCUMENTS

| | | | |
|---|---|---|---|
| 5,784,631 A * | 7/1998 | Wise | 341/65 |
| 5,951,623 A * | 9/1999 | Reynar et al. | 341/87 |
| 6,230,109 B1 * | 5/2001 | Miskimins et al. | 702/109 |
| 7,196,710 B1 * | 3/2007 | Fouladi et al. | 345/553 |
| 7,321,319 B2 * | 1/2008 | Rachwalski et al. | 341/51 |

OTHER PUBLICATIONS

"Brian Jones: Open XML Formats: Does Tag Size Matter?", MSDN Blogs, May 16, 2006, printed from http://blogs.msdn.com/brian_jones/archive/2006/05/16/599096.aspx, printed Jun. 7, 2006, 13 pages.

P. Deutsch, "Deflate Compressed Data Format Specification version 1.3", RFC1951, Aladdin Enterprises, May 1996, 17 pages.

* cited by examiner

*Primary Examiner*—Lam T Mai
(74) *Attorney, Agent, or Firm*—Pillsbury Winthrop Shaw Pittman, LLP

(57) ABSTRACT

A system and method for decompression optimization employing a data input and a dedicated back buffer and data parser. The system and method also relate to accelerating the parsing process during decompression of a block of data by taking advantage of those naturally occurring redundancies within the block of data identified at compression time. The system of the invention includes a parser and an annotated back buffer which operate collectively to optimize the parsing process during decompression.

11 Claims, 3 Drawing Sheets

Data Structure 600

| <sheet><cell>1</cell><cell>2</cell><cell>=A1+B1</cell></sheet> | ← 610 |
| AAAAAAABBBBBBCDDDDDDDBBBBBBEDDDDDDDBBBBBBFGCHICDDDDDDDJJJJJJJ | ← 620 |

Annotation Storage 400

| Pointer | Location | Parsed Form | |
|---------|----------|-------------|---|
| A | Start 0, Length 7 | <Parsed form of "sheet"> | 410 |
| B | Start 8, Length 6 | <Parsed form of "cell"> | 420 |
| C | Start 9, Length 1 | <Parsed form of "1"> | 430 |
|   | 412    414 | 404 | |

FIG. 2b

OPTIMIZED DECOMPRESSION USING ANNOTATED BACK BUFFER

FIELD OF INVENTION

This invention relates generally to parsing data during decompression, and more particularly to implementing an annotated buffer for optimizing the parsing performance during decompression of data.

BACKGROUND

Conventional compression and decompression algorithms are well known and widely used with many types of data transmission and reception. One such discussion of conventional compression and decompression techniques is the publication RFC 1951. RFC 1951 describes a lossless compressed data format.

Compression and decompression algorithms are commonly employed for point-to-point, or one-to-one system interconnections, as well as broadcast transmissions, or one-to-many interconnections. Compression algorithms reduce the representation of the information, but do not reduce the actual information. Compression algorithms create a narrower bandwidth, or a smaller number of overall bits within a data stream. Compression and decompression of a data stream is necessary when the transfer channel architecture does not directly correspond to the data to be transferred. Compression is also routinely used to accelerate the transfer of large amounts of data.

XML is a trimmed-down version of SGML (Standardized General Markup Language). XML was designed specifically for web-based data and documentation applications. XML provides a generic base on which to build other languages describing various types of data, such as XHTML for web pages, MathML for formulae etc.

The popularity and rapidly growing application of XML has also created problems with system architecture constraints relating to bandwidth and throughput capability. XML is a technology applicable to representing arbitrarily large data sets, however as data sets grow, the computational expense of handling this data also grows. Oftentimes in a medium to a large XML based spreadsheet file, millions and possibly hundreds of millions of customizable tags may be found. Almost all of these tags may appear in a given document repetitively, and the individual tags may themselves contain several kilobytes of information.

Further, another constraint with conventional XML documents is apparent when a user attempts to transfer the document intersystem. The raw file size of such a document can be very large. Therefore, when transferring such a large file, throughput issues with, for example, bandwidth become apparent with very lengthy transfer times.

The common approach for parsing compressed XML document files first requires an encoder or similarly tasked processor, to expand the compressed data. However, after the input file has been expanded or decompressed, the file must undergo a second encoding process, which is parsing the file. Oftentimes the parsing process is of considerable complexity, and further degrades throughput.

SUMMARY

The foregoing problems are solved in accordance with the following illustrative embodiments of the invention. One aspect of the invention relates to a system and method that annotates data segments, with the assistance of a back buffer, during decompression in order to distinguish repetitious data segments before they are parsed. Using annotations to effectively identify redundancies within a block of data during the decompression process can prevent the parsing process from having to re-parse the redundant data segments more than once. The system and method of the invention streamlines the parsing required during decompression (or other application) by identifying and enabling the parser to re-use previously parsed data. This allows the system and method of the invention to accelerate the parsing process during decompression without having to sacrifice accuracy.

In one or more embodiments, a system may include a processor implementing a back buffer, a parser, and annotation storage. The back buffer provides a temporary memory that receives and streams an incoming block of uncompressed data (e.g., file, email, etc.) to be parsed. According to the invention, the back buffer may annotate distinguished data segments as they are streamed. For example, a distinguished data segment may be annotated with an ASCII (or other) representation (e.g., 1, A, etc.), wherein identical data segments receive the same annotation.

The information associated with one or more annotations may be maintained at the annotation storage location. The annotation storage can link the ASCII (or other) representation used to annotate the distinguished data segment to its parsed form and the data segment's corresponding memory location within the back buffer (or elsewhere). The annotation storage can gradually build an annotated collection of data segments. Therefore, when a distinguished data segment for decompression is encountered a second time within a data stream, the parser can reference the corresponding annotation and re-use the already parsed information. Thus, the system takes advantages of redundancies in order to reduce the work the parser has to do during decompression.

BRIEF DESCRIPTION OF THE DRAWINGS

FIG. 2a is an exemplary data structure, according to one embodiment of the invention.

FIG. 2b is an exemplary data table corresponding to the data structure of FIG. 2a, according to one embodiment of the invention.

DETAILED DESCRIPTION

Figure 1:
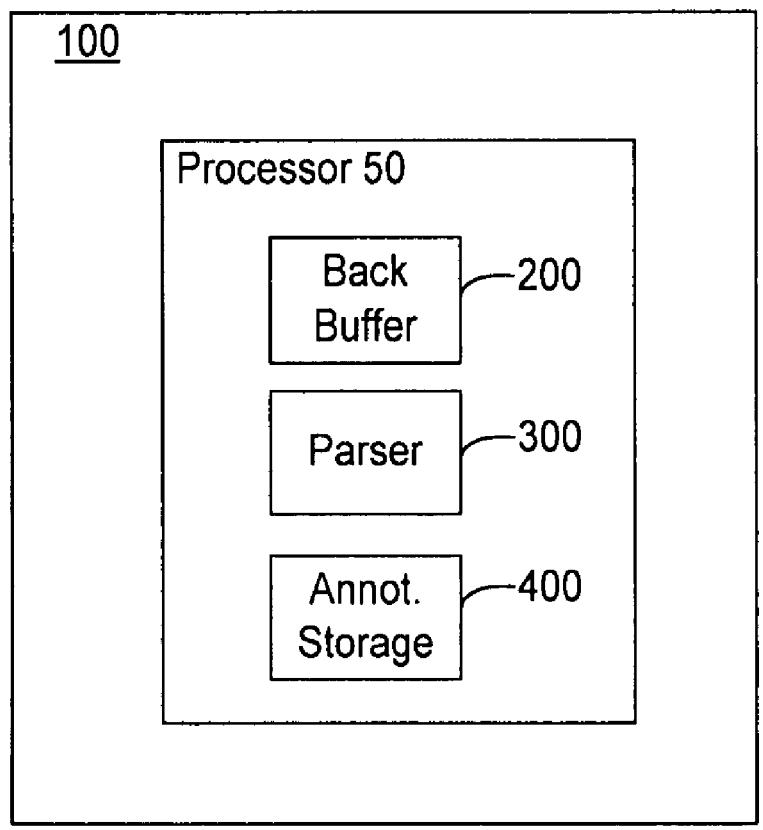
FIG. 1 is a high-level system diagram of an exemplary processor, according to one embodiment of the invention.

The present invention relates at least to accelerating the parsing process during decompression of a block of data by taking advantages of naturally occurring redundancies with the block of data. FIG. 1 illustrates a high level diagram of a computing system 100 used in accordance with one embodiment of the invention. As FIG. 1 illustrates, a processor 50 includes a back buffer 200, a parser 300, and annotated storage 400.

The system 100 including a processor 50 can operate on large (or small) blocks of data (e.g., file, email, etc.) using the back buffer 200, the parser 300 and the annotated storage 400 collectively during decompression. The back buffer 200 maintains a stream of incoming decompressed and/or compressed data represented by one or more distinguished data segments needing to be parsed. After parsing, the back buffer 200 may be annotated for each distinguished data segment based on compression algorithm used to compress the data, which removed duplications. An exemplary illustration of the annotated data is shown in FIG. 2a.

FIG. 2a illustrates a data structure 600 for an annotated back buffer 200. The data structure 600 may represent a collection of data segments incoming to the back buffer 200. The data structure 600 includes a collection of addressable locations, for example addressable rows and/or addressable columns. One such addressable row 610 may contain a specific data string. Further the data structure 600 may contain a specific pointer sequence 620. Within the specific pointer sequence 620 there may be one or more pointer characters 630 used to annotate the distinguished data segments. Thus, for every entry in row 610 there may be a corresponding entry in row 620.

For example, as shown in FIG. 2a, a distinguishable data segment within a spreadsheet file may be a tag for beginning a cell of data (e.g., <cell>), tag for closing the cell (e.g., </cell>), cell content (e.g., 1) and/or other distinguishable data segments (e.g., text word, number, phase, etc). Each distinguished data segment is annotated with a corresponding pointer character(s) 630. The same pointer character 630 can be used to annotate one or more identical data segments. By way of example, the pointer character "B" is used to annotate each occurrence of the tag "<cell>".

As the distinguishable data segments are parsed by the parser 300 and annotated by the back buffer 200, annotation data and parsed forms are catalogued for storage at the annotated storage location or locations 400. FIG. 2b illustrates an exemplary table of annotation information stored at the annotation storage location 400. The table 402 (or other format) may be used to maintain a link between the pointer characters 630, the parsed form of the data 404 (e.g., pushed back from the parser 300), and the location value within the back buffer (e.g., offset 412, length 416). For example, row 410 may contain annotation information comprising at least the parsed form for <sheet> and addressable location for the pointer character A (630). And so similarly may rows B, C, D, etc. (e.g., 420, 430). Other information may also be stored at the annotation storage location 400.

The parser 300 looks to parse distinguished data segments within the data stream supplied from the back buffer 200. Newly parsed forms may be pushed back and stored at the annotation storage location 400 for re-use at a later time within the data stream. For example, the parsed form 404 may be re-used for every instance of the same distinguished data segment during parsing. Further, as the system operates, the parser 300 in cooperation with previously encountered data segments directly addressable through the back buffer 200 and annotated storage 400 allows the throughput to increase by avoiding extra parsing of redundant data segments.

In one example, as the parser 300 operates, the annotation storage 400 gradually builds up annotation information on incoming data segments and passes on those similarities. Therefore, the parser 300 can use the data similarities to speed up the parsing process. In the given example of a spreadsheet, the similarities may indeed constitute the bulk of the file. In such a case, where the system 100 may have previously received encountered tokens, tags, or raw text strings from a storage device, the parser 300 might optimally only process the new material.

The above representation illustrates one embodiment of how a repetition in the back buffer is ascertained, and how that information may be used to determine a parsed form within an annotation storage location 400, as well as other contextual and vector information. The data structure 600 is useful for a descriptive purpose; however the invention is not limited by the literal arrangement, nor the ASCII content, or by any method direct or otherwise of associating annotations with the annotation storage.

Figure 3:
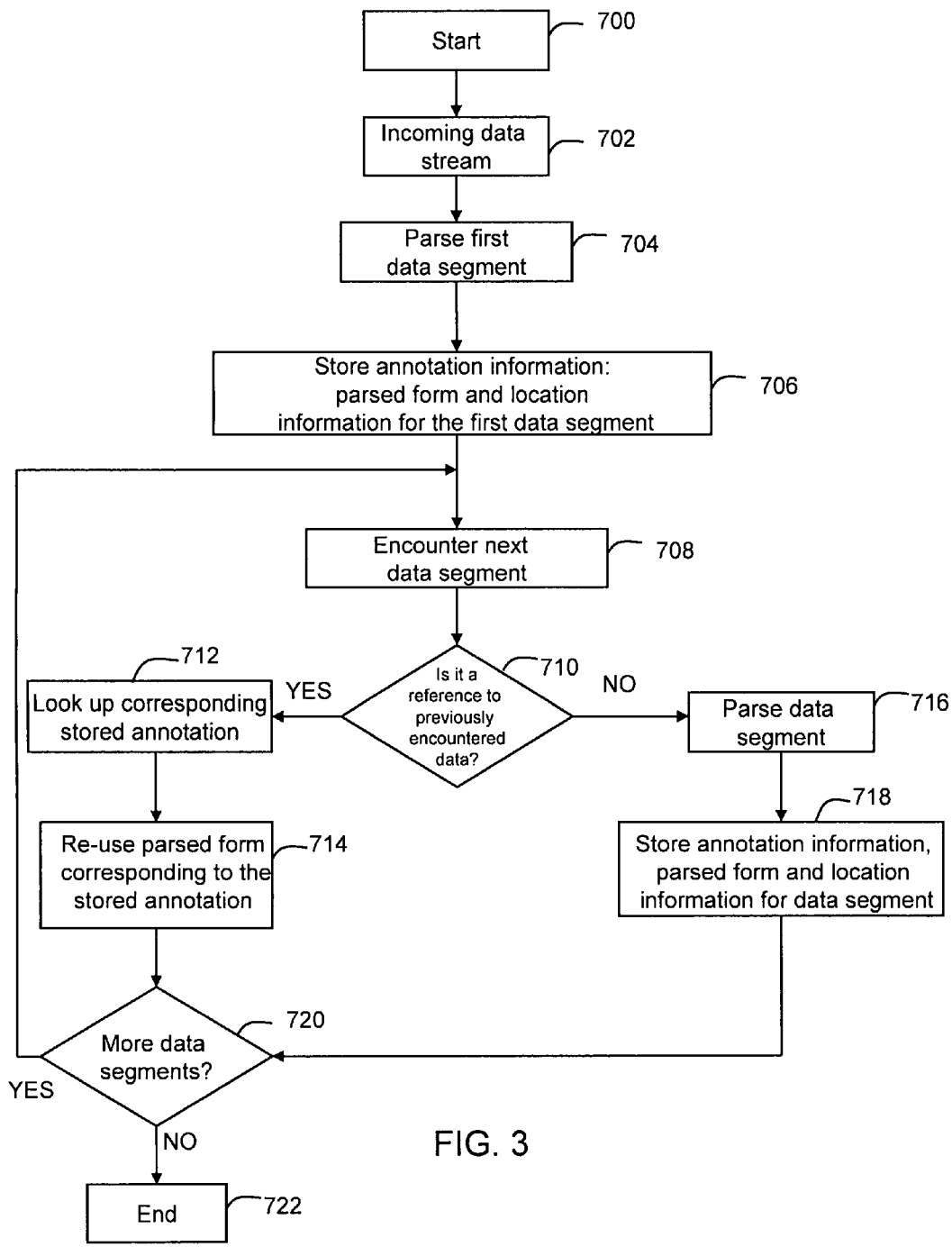
FIG. 3 is a flowchart of an exemplary method of decompression, according to one embodiment of the invention.

In one or more embodiments, a decompression method may include annotating data streams, parsing data segments, identifying redundancies and/or re-using previously parsed data forms, among other things. FIG. 3 illustrates a flowchart for an exemplary method associated with the system of the invention. FIG. 3 illustrates the method including an initialization operation 700. At operation 702, an incoming data stream may be received that may have already been at least partially decompressed by operationally tasked decompression routine and/or algorithm. Incoming data may represent data from a spreadsheet, text document, email, image, etc.

The incoming data may be in the form of one or more distinguished data segments. These segments represent either new data, or a reference to a previously encountered run of data, which may be presented in the back-buffer 200. For example, the incoming data segments may reflect information recognized during a compression process including information used to identify redundant data segments.

A parsing process may begin on a data stream by parsing a first data segment in the data stream or data string (operation 704). The parsed form for the first data segment may be stored as annotation information including the location information (e.g., offset/length pair), in operation 706. The stored information may be referenced at a later time in the data stream, as will be discussed below.

The process may continue to the next data segment in operation 708. Before the next data segment is parsed the process may determine whether this segment represents a reference to a previously encountered run of data (operation 710). If a repeated annotation is present, then the corresponding stored annotation may be retrieved (e.g., from the back-buffer 200) and referenced in operation 712. The parsed form saved at the referenced location may be re-used to represent the data segment (operation 714). The process may go on to determine whether more data segments require parsing (operation 720), at which time the process goes back to operation 708 to parse additional data segments. Otherwise the process may end at 722 and/or wait to begin again for another data stream.

If the data segment is not a reference to a previously encountered data segment but is new data, as may be determined in operation 710, the data segment is parsed as normal (operation 716). The parsed form for the data segment may be stored as annotation information including the location information (e.g., offset/length pair), in operation 718 for potential re-use later in the data stream. The process can proceed to step 720 as described above.

As the process shown in FIG. 3 proceeds to iterate through the disclosed operations (710-722), the parsing process may progressively become more and more efficient based on the collection of annotated information present in the back-buffer.

It will be appreciated by those skilled in the art that any combination of the described elements herein may be deployed as either software and or hardware. Further, in view of the various embodiments described, conventional descriptions and methods may refer to a hardware or software deployment for ease and simplicity of conveying the inventive concepts of the subject invention. These descriptions are not intended to limit the scope of the invention. Rather, the descriptions will support the broad application and breadth of the inventive concepts.

During operation, the processor 50 may execute one or more algorithms and or operations which communicate with one or more of the elements outlined above. Further the processor 50 may communicate with or through, that is to say directly or indirectly, with one or more of the elements outlined above. Still further, as FIG. 1 illustrates, all of the above elements are interconnected, and may communicate and or cooperate with each other either directly or indirectly.

While this invention has been described in conjunction with the exemplary embodiments outlined above, it is evident that many alternative, modifications and variations will be apparent to those skilled in the art. Accordingly, the exemplary embodiments of the invention, as set forth above, are intended to be illustrative, not limiting. Various changes may be made without departing from the spirit and scope of the invention, and the following claims are intended to cover such modifications and changes.

I claim:

1. A computer based system for processing data during decompression, comprising:
    a back buffer for receiving a data stream, wherein the data stream comprises one or more data segments;
    a parser module for generating parsed forms within the back buffer for one or more encountered data segments of the data stream;
    an annotation storage means for storing annotation information, wherein the annotation information comprises a representation of a parsed form for a data segment and location information within the back buffer for a generated parsed form of the data segment; and
    referencing means for referencing the annotation information to obtain the parsed form for an occurrence of a previously encountered data segment within the data stream.

2. The system of claim 1, wherein the data stream includes a structured data array.

3. The system of claim 2, wherein structured data array includes tag information.

4. The system of claim 2, wherein the data stream includes a raw binary data stream.

5. The system of claim 2, wherein the location information comprises an offset and length pair reference into the structured data array.

6. A computer based method for processing data during decompression, comprising:
    receiving a data stream at a back buffer, wherein the data stream comprises one or more data segments;
    generating parsed forms within the back buffer for the one or more data encountered segments of the data stream;
    storing annotation information, wherein the annotation information comprises a representation of a parsed form for a data segment and location information within the back buffer for a generated parsed form of the data segment; and
    referencing the annotation information to obtain the parsed form for an occurrence of a previously encountered data segment within the data stream.

7. The system of claim 6, wherein the data stream includes a structured data array.

8. The system of claim 7, wherein structured data array includes tag information.

9. The system of claim 7, wherein the data stream includes a raw binary data stream.

10. The system of claim 7, wherein the location information comprises an offset and length pair reference into the structured data array.

11. A computer based method for optimizing the parsing process for decompression, comprising:
    parsing a first data segment to generate a first parsed form;
    storing the first parsed form in association with a first annotation;
    encountering a next data segment;
    determining if the next data segment is a reference to the first data segment; and
        if so, then re-using the first parsed form associated with the first annotation to represent the next data segment; or
        if not, then parsing the next data segment to generate a next parsed form; and storing the next parsed form in association with a next annotation.

* * * * *